United States Patent
Chen et al.

(10) Patent No.: US 11,189,754 B2
(45) Date of Patent: Nov. 30, 2021

(54) SEMICONDUCTOR SUBSTRATE

(71) Applicant: EPISTAR CORPORATION, Hsinchu (TW)

(72) Inventors: Meng-Yang Chen, Hsinchu (TW); Rong-Ren Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/452,126

(22) Filed: Jun. 25, 2019

(65) Prior Publication Data
US 2019/0393380 A1   Dec. 26, 2019

(30) Foreign Application Priority Data
Jun. 26, 2018 (TW) .................... 107121783

(51) Int. Cl.
*H01L 33/18* (2010.01)
*H01L 21/02* (2006.01)
(Continued)

(52) U.S. Cl.
CPC .......... *H01L 33/18* (2013.01); *H01L 21/0243* (2013.01); *H01L 21/02381* (2013.01); *H01L 21/02461* (2013.01); *H01L 21/02463* (2013.01); *H01L 21/02538* (2013.01); *H01L 21/02543* (2013.01); *H01L 21/02598* (2013.01); *H01L 21/2007* (2013.01); *H01L 29/04* (2013.01); *H01L 29/205* (2013.01);
(Continued)

(58) Field of Classification Search
CPC ............. H01L 33/0025; H01L 33/0066; H01L 33/025; H01L 33/18; H01L 33/30; H01L 29/04; H01L 29/045; H01L 29/0603; H01L 21/02381; H01L 21/0243; H01L 21/02455–02466; H01L 21/02538–02549
See application file for complete search history.

(56) References Cited

U.S. PATENT DOCUMENTS 5,321,712 A * 6/1994 Itaya .................. H01L 33/30
     372/43.01
5,389,800 A * 2/1995 Itaya .................. H01L 33/40
     257/94
(Continued)

FOREIGN PATENT DOCUMENTS

TW         201735394 A       10/2017

OTHER PUBLICATIONS

N. Noto et al, "Growth of GaAs on Si Using AlGaP Intermediate Layer", 1989, Materials Research Society, Mat. Res. Soc. Symp. Proc. vol. 148, pp. 247-252. (Year: 1989).*
(Continued)

*Primary Examiner* — Victoria K. Hall
(74) *Attorney, Agent, or Firm* — Ditthavong, Steiner & Mlotkowski

(57) ABSTRACT

A semiconductor substrate is provided in the present disclosure. The semiconductor substrate includes a first semiconductor layer and a second semiconductor layer on the first semiconductor layer. The first semiconductor layer has a first lattice constant (L1) and the second semiconductor layer has a second lattice constant (L2). A ratio of a difference (L2-L1) between the second lattice constant (L2) and the first lattice constant (L1) to the first lattice constant (L1) is greater than 0.036.

20 Claims, 9 Drawing Sheets

(51) Int. Cl.
*H01L 33/00* (2010.01)
*H01L 33/30* (2010.01)
*H01L 29/04* (2006.01)
*H01L 29/205* (2006.01)
*H01L 29/778* (2006.01)
*H01L 33/02* (2010.01)
*H01L 21/20* (2006.01)
*H01S 5/22* (2006.01)

(52) U.S. Cl.
CPC ........ *H01L 29/778* (2013.01); *H01L 33/0025* (2013.01); *H01L 33/0062* (2013.01); *H01L 33/0066* (2013.01); *H01L 33/025* (2013.01); *H01L 33/30* (2013.01); *H01L 33/0093* (2020.05); *H01S 5/2206* (2013.01)

(56) References Cited

U.S. PATENT DOCUMENTS

| | | | | |
|---|---|---|---|---|
| 5,471,076 | A * | 11/1995 | Murakami | H01L 31/0352 257/184 |
| 5,981,976 | A * | 11/1999 | Murasato | H01L 33/30 257/94 |
| 7,795,622 | B2 * | 9/2010 | Kikkawa | H01L 29/7783 257/76 |
| 9,040,342 | B2 * | 5/2015 | Lin | H01L 31/1844 438/74 |
| 9,337,381 | B2 * | 5/2016 | Kim | H01L 33/12 |
| 9,349,590 | B2 * | 5/2016 | Hikosaka | H01L 21/0254 |
| 10,181,526 | B2 * | 1/2019 | Cantoro | H01L 21/823431 |
| 10,361,307 | B2 * | 7/2019 | Basker | H01L 21/823821 |
| 10,505,025 | B1 * | 12/2019 | Doornbos | H01L 29/0657 |
| 2006/0124956 | A1 * | 6/2006 | Peng | H01L 21/0237 257/103 |
| 2007/0164364 | A1 * | 7/2007 | Kawasaki | H01L 21/823807 257/368 |
| 2010/0221512 | A1 * | 9/2010 | Lee | H01L 21/02507 428/213 |
| 2010/0244163 | A1 * | 9/2010 | Daibou | G11C 11/161 257/421 |
| 2010/0282305 | A1 | 11/2010 | Sharps et al. | |
| 2011/0290312 | A1 * | 12/2011 | Agui | H01L 31/1844 136/255 |
| 2012/0032209 | A1 * | 2/2012 | Shioda | H01L 21/0254 257/94 |
| 2012/0088342 | A1 * | 4/2012 | Ming | H01L 21/823814 438/230 |
| 2012/0247547 | A1 * | 10/2012 | Sasaki | H01L 31/06875 136/255 |
| 2012/0300168 | A1 * | 11/2012 | Hoke | G02F 1/292 349/202 |
| 2013/0087762 | A1 * | 4/2013 | Hung | H01L 29/812 257/13 |
| 2013/0237036 | A1 * | 9/2013 | Hikosaka | H01L 21/02458 438/478 |
| 2014/0227527 | A1 * | 8/2014 | Brors | F27B 14/10 428/411.1 |
| 2015/0140710 | A1 * | 5/2015 | McLaurin | H01S 5/32025 438/31 |
| 2015/0229108 | A1 * | 8/2015 | Steigerwald | H01S 5/4031 372/45.01 |
| 2015/0318364 | A1 * | 11/2015 | Cai | H01L 29/66628 438/285 |
| 2016/0035849 | A1 * | 2/2016 | Ching | H01L 29/78696 257/27 |
| 2016/0148959 | A1 * | 5/2016 | Cheng | H01L 31/028 257/290 |
| 2016/0149074 | A1 * | 5/2016 | Atanackovic | H01L 33/007 257/13 |
| 2017/0092485 | A1 * | 3/2017 | Brueck | H01L 21/0251 |
| 2018/0129079 | A1 * | 5/2018 | Lee | G02B 6/10 |
| 2018/0261724 | A1 * | 9/2018 | Park | H01L 33/0075 |
| 2019/0097033 | A1 * | 3/2019 | Sugita | H01L 29/205 |
| 2019/0103553 | A1 * | 4/2019 | Hong | H01F 10/329 |
| 2019/0244973 | A1 * | 8/2019 | Yoo | H01L 21/022 |
| 2019/0348503 | A1 * | 11/2019 | Kimura | H01L 29/1602 |
| 2020/0058338 | A1 * | 2/2020 | Ishikawa | G11C 11/1673 |
| 2020/0067267 | A1 * | 2/2020 | Takayama | H01S 5/02484 |
| 2020/0161504 | A1 * | 5/2020 | Fimland | H01L 33/30 |
| 2020/0357978 | A1 * | 11/2020 | Kijima | C23C 14/082 |

OTHER PUBLICATIONS

J. E. Ayers, New model for the thickness and mismatch dependencies of threading dislocation densities in mismatched heteroepitaxial layers, 1995, J. Applied Physics, vol. 78, Issue 6, pp. 3724-3726. (Year: 1995).*

A. E. Romanov et al., Modeling of Threading Dislocation Density Reduction in Heteroepitaxial Layers, 1997, Phys. Stat. Sol. (b) vol. 199, pp. 33-49. (Year: 1997).*

Noto et al., "Growth of Gaas on Si Using Algap Intermediate Layer", published in Cambridge Core, MRS Proceedings, vol. 148. doi:10.1557/proc-148-247, retrieved on Jun. 25, 2019, from https://doi.org/10.1557/PROC-148-24, 2 pages.

Soga et al., "Charactenzation of epitaxially grown GaAs on bi substrates with IIIV compounds intermediate layers by metalorganic chemical vapor deposition", published in AIP Journal of Applied Physics 57, 4578, retrieved on Jun. 25, 2019 form http://dx.doi.org/10.1063/1.335363, 6 pages.

Soga et al., "Defect Characterization of GaAs on Si Grown by MOCVD", published in (1989) The Japan Society of Applied Physics Japanese Journal of Applied Physics, vol. 28, Part 1, No. 12, pp. 2441-2445, 6 pages.

MOCVD Growth of GaAs on Si Substrates with AlGaP with Strained Superlattice Layers, Electronics Letters, SOGA et al., Oct. 25, 1984, vol. 20 , Issue: 22 , pp. 916-918, 3 pages.

* cited by examiner

SEMICONDUCTOR SUBSTRATE

CROSS REFERENCE TO RELATED APPLICATIONS

This application claims the right of priority based on TW Application Serial No. 107121783, filed on Jun. 26, 2018, and the content of which is hereby incorporated by reference in its entirety.

FIELD OF DISCLOSURE

The present disclosure relates to a semiconductor substrate.

BACKGROUND OF THE DISCLOSURE

Light-emitting diodes (LEDs) are widely used as solid-state lighting sources. Compared to conventional incandescent light bulbs or fluorescent lamps, LEDs have advantages of low energy consumption and long lifetime. Therefore, LEDs have gradually replaced conventional lighting sources and have been applied to a variety of fields, such as traffic signs, backlight modules, street lighting systems, and medical equipment.

SUMMARY OF THE DISCLOSURE

The present disclosure provides a semiconductor substrate including a first semiconductor layer and a second semiconductor layer on the first semiconductor layer. The first semiconductor layer has a first lattice constant (L1) and the second semiconductor layer has a second lattice constant (L2). A ratio of a difference (L2−L1) between the second lattice constant (L2) and the first lattice constant (L1) to the first lattice constant (L1) is greater than 0.036.

The present disclosure further provides a method for manufacturing a semiconductor substrate, and the method includes providing a growth substrate. A first semiconductor layer is epitaxially grown on the growth substrate, and the semiconductor layer has a first lattice constant (L1). A second semiconductor layer is epitaxially grown on the growth substrate, and the semiconductor layer has a second lattice constant (L2). A ratio of a difference (L2−L1) between the second lattice constant (L2) and the first lattice constant (L1) to the first lattice constant (L1) is greater than 0.036.

DETAILED DESCRIPTION OF THE DISCLOSURE

Figure 1:
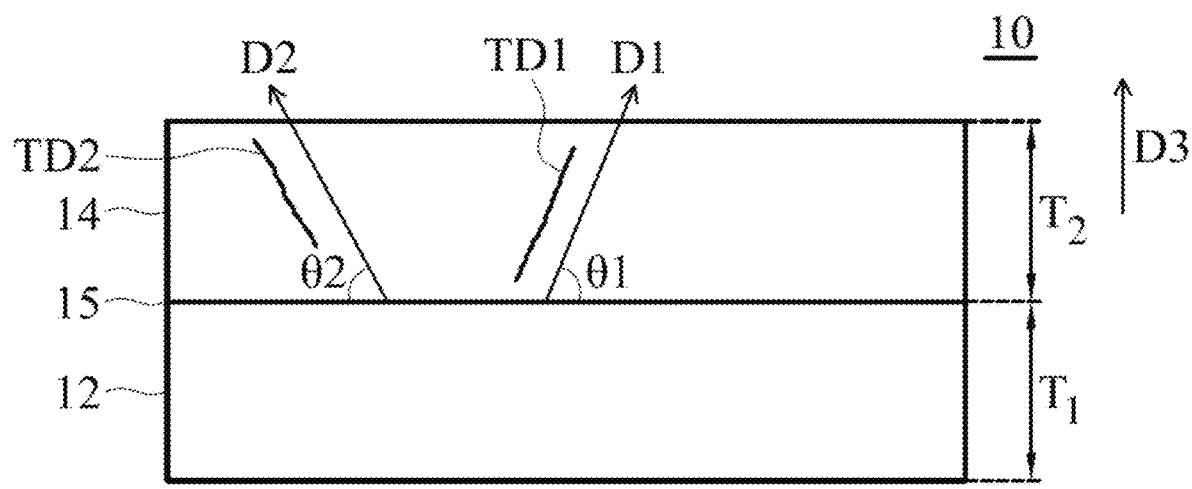
FIG. 1 shows a schematic sectional view of a semiconductor substrate in accordance with an embodiment of the present disclosure.

The following embodiments will be described with accompanying drawings to disclose the concept of the present disclosure. In the drawings or description, same or similar portions are indicated with same numerals. Furthermore, a shape or a thickness of a component in the drawings may be enlarged or reduced. Particularly, it should be noted that a component which is not illustrated or described in drawings or description may be in a form that is known by a person skilled in the art. To describe the present disclosure in a clear and concise manner, repeated descriptions of same or similar elements may be omitted in the embodiments.

In the present disclosure, if not otherwise specified, the general formula AlGaInP represents $(Al_{y1}Ga_{(1-y1)})_{1-x1}In_{x1}P$, wherein $0 \leq x1 \leq 1$, and $0 \leq y1 \leq 1$; the general formula AlAsSb represents $AlAs_{(1-x2)}Sb_{x2}$, wherein $0 \leq x2 \leq 1$; the general formula InGaAsP represents $In_{x3}Ga_{1-x3}As_{1-y2}P_{y2}$, wherein $0 \leq x3 \leq 1$, and $0 \leq y2 \leq 1$; the general formula AlGaAsP represents $Al_{x4}Ga_{1-x4}As_{1-y3}P_{y3}$, wherein $0 \leq x4 \leq 1$, and $0 \leq y3 \leq 1$; the general formula InGaSb represents $In_{x5}Ga_{1-x5}Sb$, wherein $0 \leq x5 \leq 1$.

A semiconductor substrate is provided in the present disclosure. Referring to FIG. 1, in accordance with an embodiment of the present disclosure, a semiconductor substrate 10 may include a first semiconductor layer 12 and a second semiconductor layer 14 located on the first semiconductor layer 12. The first semiconductor layer 12 has a first lattice constant L1, and the second semiconductor layer 14 has a second lattice constant L2. A ratio of a difference (L2−L1) between the second lattice constant L2 and the first lattice constant L1 to the first lattice constant L1 is greater than 0.036. Specifically, the relationship between the first lattice constant L1 of the first semiconductor layer 12 and the second lattice constant L2 of the second semiconductor layer 14 fulfills the following formula:

$$((L2-L1)/L1) \times 100\% > 3.6\%$$

In accordance with some embodiments of the present disclosure, the ratio of the difference (L2−L1) between the second lattice constant (L2) and the first lattice constant (L1) to the first lattice constant (L1) may be greater than 0.036 and not greater than 0.2. The ratio is preferably between 0.04 and 0.1 (both included), or more preferably, between 0.04 and 0.08 (both included). Specifically, the relationship between the first lattice constant (L1) of the first semiconductor layer 12 and the second lattice constant (L2) of the second semiconductor layer 14 fulfills the following formula:

$$3.6\% < ((L2-L1)/L1) \times 100\% < 20\%$$

The term "lattice constant" used in the present disclosure is defined by measuring an X-ray diffraction (XRD) pattern of a semiconductor layer at a temperature of 300K. Lattice constants of several semiconductor materials are listed in Table 1.

TABLE 1

| | Lattice constant(Å) |
|---|---|
| Si | 5.43 |
| GaP | 5.45 |
| AlP | 5.45 |
| Ge | 5.66 |
| GaAs | 5.65 |
| InP | 5.87 |
| GaSb | 6.09 |

Referring to FIG. 1, in the semiconductor substrate 10 disclosed in the present disclosure, the first semiconductor layer 12 directly contacts the second semiconductor layer 14. Specifically, there is no layer between the first semiconductor layer 12 and the second semiconductor layer 14 to separate the first semiconductor layer 12 from the second semiconductor layer 14. More specifically, there is only a single interface structure 15 (that is, not two or more interface structures) between the first semiconductor layer 12 and the second semiconductor layer 14.

In accordance with an embodiment of the present disclosure, the first semiconductor layer 12 includes a first crystal structure, and the second semiconductor layer 14 includes a second crystal structure. The first crystal structure may be the same as the second crystal structure. Specifically, the first semiconductor layer 12 and the second semiconductor layer 14 include the same crystal structure. For example, both the first semiconductor layer 12 and the second semiconductor layer 14 include a zinc blende crystal structure. The crystal structures of the first semiconductor layer and the second semiconductor layer may be determined by any appropriate method, such as X-ray diffraction (XRD) analysis, selected area diffraction (SAD) analysis, or convergent-beam electron diffraction (CBED) analysis.

Referring to FIG. 1, in the semiconductor substrate of the present disclosure, the number of threading dislocations (such as threading dislocations TD1 and TD2) in the second semiconductor layer 14 may be reduced, thereby effectively reducing the number of crystallographic defects in the second semiconductor layer 14, and the semiconductor substrate with a better epitaxial quality can be obtained. To be more specific, in the semiconductor substrate disclosed in the present disclosure, a misfit dislocation (not shown) may exist in the interface structure 15 between the first semiconductor layer 12 and the second semiconductor layer 14. The threading dislocations TD1 and TD2 may have extension directions D1 and D2, respectively. Specifically, the extension direction D1 may correspond to a direction along where the threading dislocation TD1 extends to, and the extension direction D2 may correspond to a direction along where the threading dislocation TD2 extends to. There may be an included angle θ1 between the extension direction D1 and the interface structure 15, and an included angle θ2 between the extension direction D2 and the interface structure 15. Each of the included angles θ1 and θ2 is between 20 to 90 degrees.

In an embodiment, an upper surface of the second semiconductor layer 14 in the semiconductor substrate of the present disclosure may have a geometric average roughness (Rq) of 50 nm or less, preferably of 30 nm or less, and more preferably of 10 nm or less. In an embodiment, a range for measuring the geometric average roughness (Rq) is 1 μm×1 μm.

In accordance with an embodiment of the present disclosure, the second semiconductor layer 14 has a threading dislocation density of $10^9/cm^2$ or less, and preferably of $10^8/cm^2$ or less. The threading dislocation density (that is, the number of threading dislocations per square centimeters) may be obtained by calculating the number of threading dislocations shown in a TEM (transmission electron microscope) image.

In accordance with an embodiment of the present disclosure, the first semiconductor layer 12 and the second semiconductor layer 14 may include III-V semiconductor material. Preferably, the III-V semiconductor material includes Ga, Al, As, P, Sb or In. More preferably, the III-V semiconductor material does not include N. The III-V semiconductor material may be InGaAsP, AlInGaP, InGaSb, or AlAsSb. In an embodiment, the III-V semiconductor material of the first semiconductor layer 12 includes Ga, and the III-V semiconductor material of the second semiconductor layer 14 includes In. In an embodiment, the first semiconductor layer 12 may include GaAs, and the second semiconductor layer 14 may include InP. In an embodiment, the first semiconductor layer 12 may include AlP, and the second semiconductor layer 14 may include InP. In an embodiment, the first semiconductor layer 12 may include $AlaGa_{(1-a)}P$, and the second semiconductor layer 14 may include InP. In an embodiment, $0.45 \leq a \leq 0.55$.

In accordance with some embodiments of the present disclosure, the first semiconductor layer 12 includes AlP, and the second semiconductor layer 14 does not include GaAs. In an embodiment, the first semiconductor layer 12 includes $Al_bGa_{(1-b)}P$, and the second semiconductor layer 14 does not include GaAs. In an embodiment, $0.01 \leq b \leq 0.99$, and preferably $0.45 \leq b \leq 0.55$.

In accordance with an embodiment of the present disclosure, the second semiconductor layer 14 does not include GaAs. In addition, in accordance with some embodiments of the present disclosure, the second semiconductor layer 14 may include InP.

Referring to FIG. 1, the semiconductor substrate 10 has a reference direction D3. In an embodiment, the reference direction D3 may correspond to an epitaxial growth direction. The first semiconductor layer 12 may have a first thickness $T_1$, and the second semiconductor layer 14 may have a second thickness $T_2$. In accordance with an embodiment of the present disclosure, the second thickness $T_2$ may larger than or equal to the first thickness $T_1$. Preferably, the second thickness $T_2$ is larger than the first thickness $T_1$, such that the number of threading dislocations in the upper surface of the second semiconductor layer 14 can be reduced. In an embodiment, the first thickness $T_1$ may be less than or equal to 500 nm (for example, between 30 nm and 500 nm, both included), and the second thickness $T_2$ may be larger than or equal to 500 nm (for example, between 500 nm to 5 μm, both included). When the first thickness $T_1$ is less than 30 nm or larger than 500 nm, the number of threading dislocations in the second semiconductor layer 14 may not be reduced and the epitaxial quality of the semiconductor substrate may not be improved. In the present disclosure, a direction for measuring the thickness is parallel to the reference direction D3.

In accordance with an embodiment of the present disclosure, the first semiconductor layer 12 and the second semiconductor layer 14 may be unintentionally doped, which include dopants with a doping concentration less than $1 \times 10^{17}/cm^3$. In an embodiment, the first semiconductor layer 12 and the second semiconductor layer 14 may be intentionally doped. The first semiconductor layer 12 and the second semiconductor layer 14 may have the same conductivity type or may include the same dopant. Furthermore, the first semiconductor layer 12 and the second semiconductor layer 14 may also have different conductivity types or may include different dopants. The dopant may include C, Mg, Si, Zn, or Sb, but not limited thereto. The doping concentration of the dopant may not be less than $1\times10^{17}/cm^3$. For example, the doping concentration of the dopant may be between $1\times10^{17}/cm^3$ to $1\times10^{21}/cm^3$ (both included), and preferably between $1\times10^{17}/cm^3$ and $1\times10^{19}/cm^3$ (both included). For example, the first semiconductor layer 12 and the second semiconductor layer 14 may be n-type or p-type semiconductor layers. In accordance with some embodiments of the present disclosure, the first semiconductor layer 12 and the second semiconductor layer 14 may be n-type semiconductor layers.

In an embodiment, the interface structure 15 has a thickness between 5 nm and 60 nm along the reference direction D3. In an embodiment, the interface structure 15 includes a material of the first semiconductor layer 12 and a material of the second semiconductor layer 14 at the same time.

Figure 2:
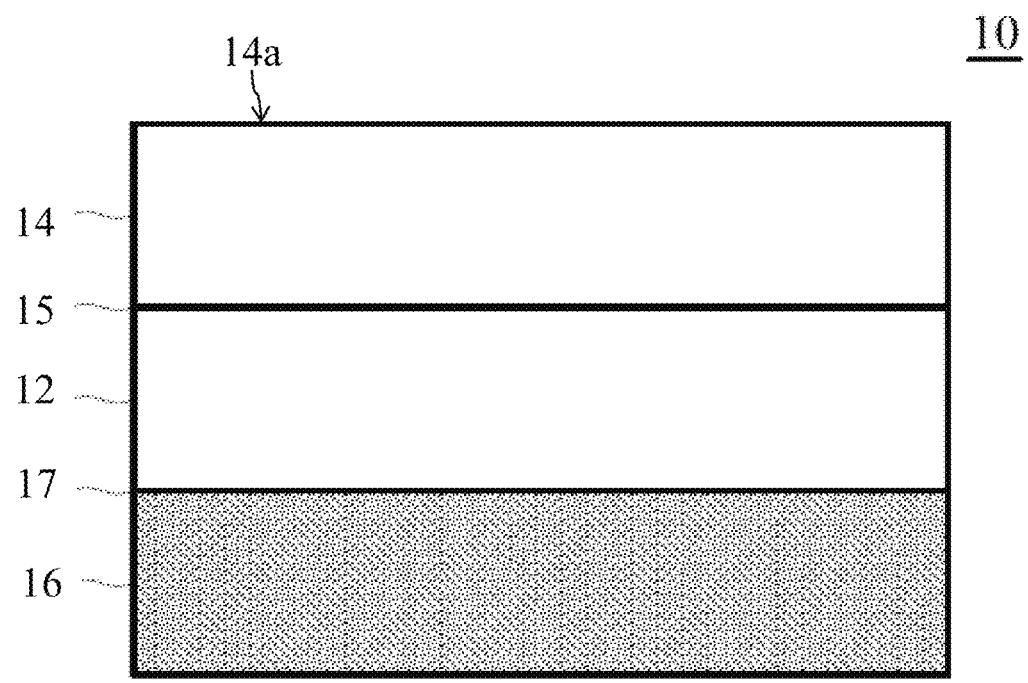
FIG. 2 shows a schematic sectional view of a semiconductor substrate in accordance with another embodiment of the present disclosure.

Referring to FIG. 2, in accordance with an embodiment of the present disclosure, the semiconductor substrate 10 may further include a growth substrate 16, and the first semiconductor layer 12 is between the growth substrate 16 and the second semiconductor layer 14. The growth substrate 16 includes a third crystal structure which is different from the first crystal structure. Specifically, the growth substrate 16 and the first semiconductor layer 12 include different crystal structures, and the growth substrate 16 and the second semiconductor layer 14 also include different crystal structures. For example, the third crystal structure may include a diamond crystal structure. In addition, in accordance with an embodiment of the present disclosure, the third crystal structure includes a diamond crystal structure, and the first crystal structure and/or the second crystal structure may include a zinc blende crystal structure. The third crystal structure of the growth substrate 16 may be determined by any appropriate methods, such as X-ray diffraction (XRD) analysis, selected area diffraction (SAD) analysis, or convergent-beam electron diffraction (CBED) analysis.

In accordance with an embodiment of the present disclosure, the first semiconductor layer 12 and the growth substrate 16 are lattice-matched. Specifically, the growth substrate 16 may have a third lattice constant (L3), and a ratio of a difference (L1-L3) between the first lattice constant (L1) of the first semiconductor layer 12 and the third lattice constant (L3) of the growth substrate 16 to the third lattice constant (L3) may be between −0.005 and 0.005. The relationship between the first lattice constant (L1) of the first semiconductor layer 12 and the third lattice constant (L3) of the growth substrate 16 can be represented by the following formula:

$$-0.5\% \leq ((L1-L3)/L3)\times 100\% \leq 0.5\%.$$

The semiconductor substrate 10 disclosed in the present disclosure may include the growth substrate 16, the first semiconductor layer 12 and the second semiconductor layer 14. By including the first semiconductor layer 12 which is lattice-matched with the growth substrate 16 but includes different crystal structures, the number of threading dislocations in the second semiconductor layer 14 may be reduced, and a semiconductor substrate with a better epitaxial quality can be obtained. To be more specific, in the present disclosure, a misfit dislocation may exist in the interface structure 15 between the first semiconductor layer 12 and the second semiconductor layer 14 (not shown) in the semiconductor substrate 10.

In an embodiment, an upper surface of the semiconductor substrate of the present disclosure (that is, an upper surface 14a of the second semiconductor layer 14) may have a geometric average roughness (Rq) of 50 nm or less, preferably of 30 nm or less, and more preferably of 10 nm or less. In an embodiment, a range for measuring the geometric average roughness (Rq) is 1 μm×1 μm.

In accordance with an embodiment of the present disclosure, a material of the growth substrate 16 may include Si or Ge. For example, the first semiconductor layer 12 includes AlP or $Al_cGa_{(1-c)}P$, the second semiconductor layer 14 includes InP, and a material of the growth substrate 16 may include Si. In an embodiment, $0.01 \leq c \leq 0.99$, and and preferably $0.45 \leq c \leq 0.55$. Or, the first semiconductor layer 12 includes GaAs and the second semiconductor layer 14 includes InP, and a material of the growth substrate 16 may include Ge.

Referring to FIG. 2, the growth substrate 16 directly contacts the first semiconductor layer 12. Specifically, there is no layer between the growth substrate 16 and the first semiconductor layer 12 to separate the growth substrate 16 from the first semiconductor layer 12. More specifically, there is only a single interface structure 17 (that is, not two or more interface structures) between the growth substrate 16 and the first semiconductor layer 12.

The present disclosure further provides a semiconductor device. The semiconductor device includes the semiconductor substrate as described in above embodiments. The semiconductor device may further include another layer or structure formed on the semiconductor substrate. The semiconductor device of the present disclosure may be a high electron mobility transistor (HEMT), a sensor, a solar cell, a laser diode or a light-emitting diode. In an embodiment, the semiconductor device of the present disclosure is a light-emitting diode. The semiconductor device includes a functional structure on the second semiconductor layer 14. The functional structure includes an active region. In an embodiment, the active region may emit a radiation including light. The light may have a peak wavelength between 800 nm and 3000 nm, preferably between 1100 nm and 1700 nm.

In accordance with an embodiment, a method for manufacturing a semiconductor device is also provided in the present disclosure. FIGS. 3A to 3E show a series of schematic views for illustrating the method for manufacturing the semiconductor device. The method for manufacturing the semiconductor device is described as follows.

Figure 3A:
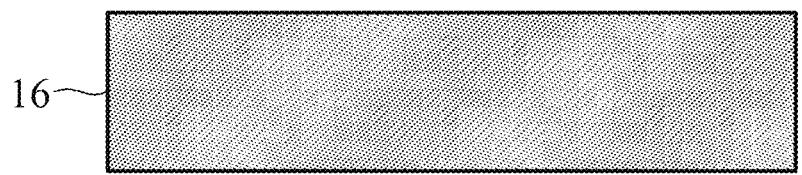
FIGS. 3A to 3E show schematic sectional views of manufacturing processes of a semiconductor device in accordance with an embodiment of the present disclosure.
Figure 3B:

First, referring to FIG. 3A, a growth substrate 16 is provided. Then, referring to FIG. 3B, a first semiconductor layer 12 is epitaxially grown on the growth substrate 16, and the first semiconductor layer 12 has a first lattice constant L1. The method for epitaxial growth includes metal-organic chemical vapor deposition (MOCVD), hydride vapor phase epitaxy (HVPE), molecular beam epitaxy (MBE) or liquid-phase epitaxy (LPE), but not limited thereto.

Figure 3C:
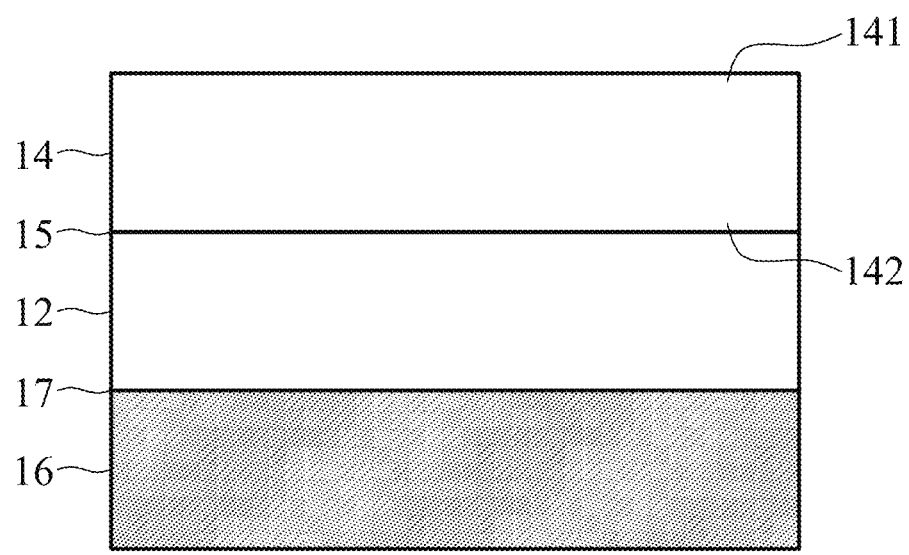

Next, referring to FIG. 3C, a second semiconductor layer 14 is epitaxially grown on the first semiconductor layer 12, so as to form a semiconductor substrate 10. The second semiconductor layer 14 has a second lattice constant L2. In the embodiment, a ratio of a difference (L2−L1) between the second lattice constant (L2) and the first lattice constant (L1) to the first lattice constant (L1) is greater than 0.036. The second semiconductor layer 14 includes a first side 141 and a second side 142. The first side 141 and the second side 142 are in opposite directions. The second side 142 of the second semiconductor layer 14 is between the first side 141 and the first semiconductor layer 12.

Figure 3D:
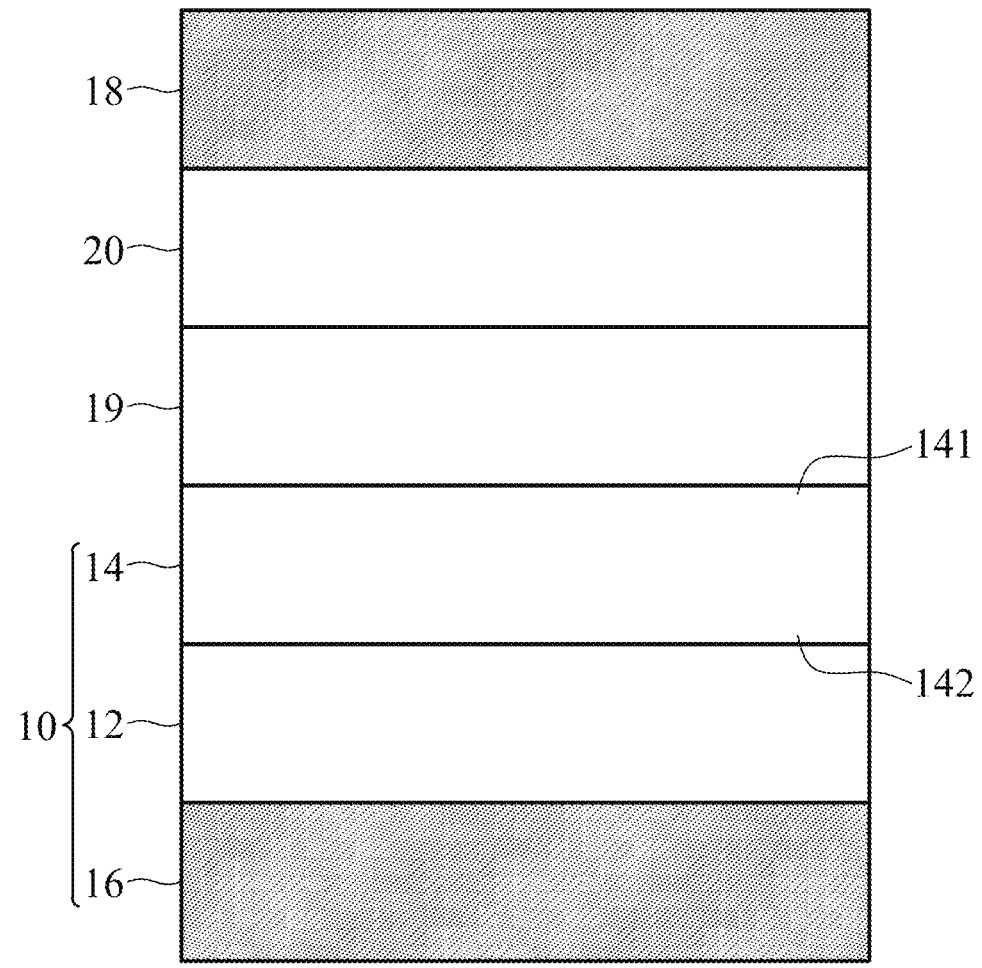

Referring to FIG. 3D, after epitaxially growing the second semiconductor layer 14, a functional structure 19 is formed on the first side 141 of the second semiconductor layer 14. In an embodiment, the semiconductor device is a light-emitting diode or a laser diode, and the functional structure 19 includes an active region. In an embodiment, the semiconductor device is a high electron mobility transistor (HEMT), and the functional structure 19 includes a channel structure. In an embodiment, the channel structure includes GaAs. In another embodiment, the channel structure includes GaN. In an embodiment, the channel structure only includes one material such as GaAs. In another embodiment, the channel structure only includes one material such as GaN.

Referring to FIG. 3D, the method for manufacturing the semiconductor device may further includes bonding a carrier substrate 18 to the first side 141 of the second semiconductor layer 14. The method for bonding the carrier substrate 18 to the second semiconductor layer 14 may include bonding the carrier substrate 18 to the functional structure 19 by a bonding layer 20, but not limited thereto. The carrier substrate 18 may be a conductive substrate or an insulating substrate. A material of the carrier substrate 18 may include an insulative material such as sapphire ($Al_2O_3$), AlN or glass, or a conductive material such as Cu, SiC, Mo, MoW, ZnO, Si, CuW, but not limited thereto. The bonding layer 20 includes a transparent conductive oxide (TCO), a metal, an insulating material or a polymer. The transparent conductive oxide may include ITO, InO, SnO, CTO, ATO, AZO, ZTO, GZO, IWO, ZnO or IZO. The metal may include In, Sn, Au, Pt, W, Ti, Al, Ni or an alloy thereof. The insulating material may include $AlO_x$, $SiO_x$ or $SiO_xN_y$. The polymer may include epoxy, polyimide, perfluorocyclobutane, benzocyclobutene (BCB) or silicone. A thickness of the bonding layer 20 may be between 400 nm and 5000 nm (both included).

Figure 3E:
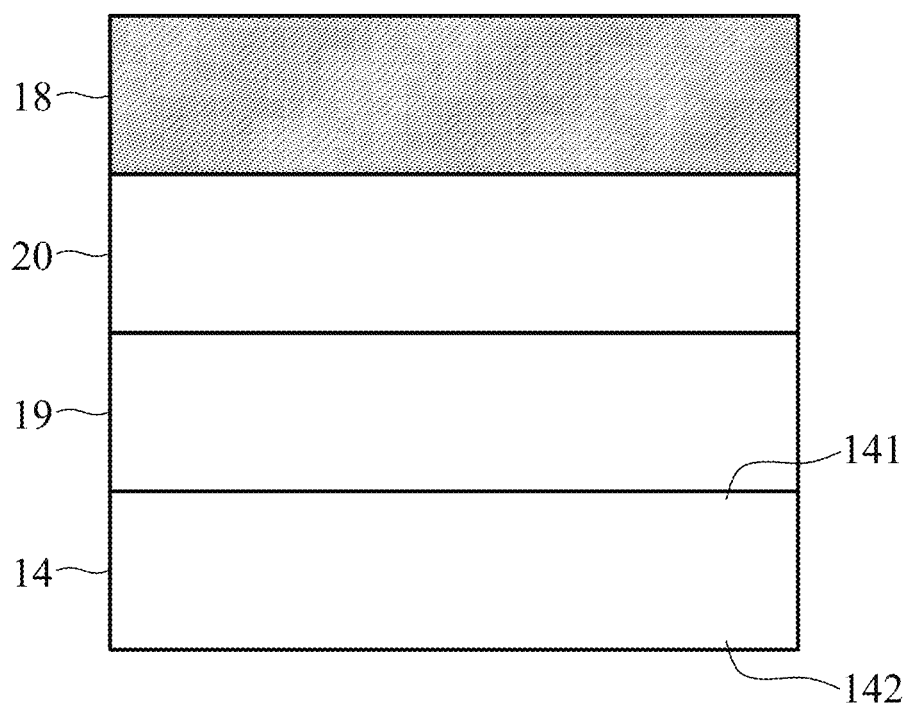

Referring to FIG. 3E, in the embodiment, the method for manufacturing the semiconductor device may further include removing the growth substrate 16 and the first semiconductor layer 12 at the same time. A method for removing the growth substrate 16 and the first semiconductor layer 12 includes wet etching or dry etching, but not limited thereto.

Figure 4:
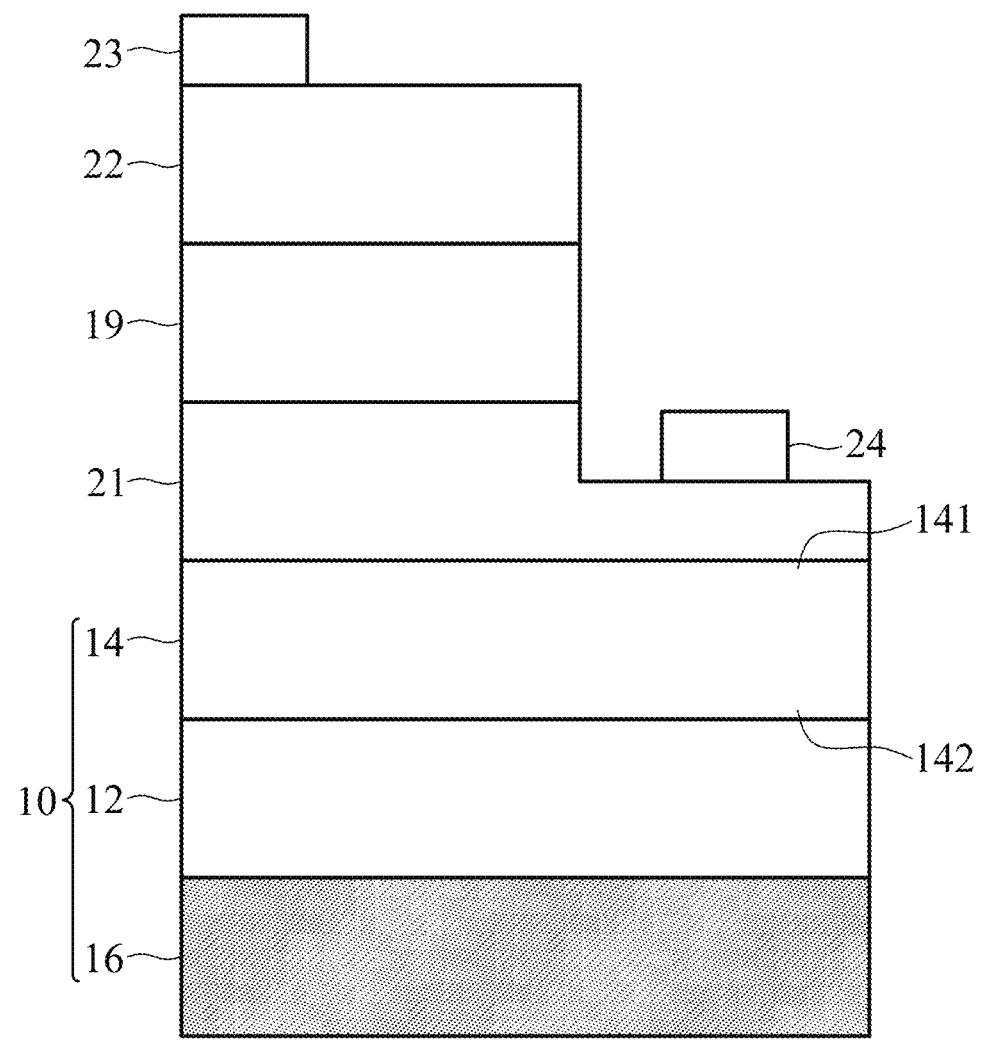
FIG. 4 shows a schematic sectional view of a semiconductor device in accordance with an embodiment of the present disclosure.

FIG. 4 shows a schematic sectional view of a semiconductor device in accordance with an embodiment of the present disclosure. In the embodiment, the semiconductor device is a light-emitting diode. The semiconductor device includes a semiconductor substrate 10 as shown in FIG. 2. The semiconductor device further includes a functional structure 19 which includes an active region. The active region may include a single heterostructure (SH), a double heterostructure (DH), a double-side double heterostructure (DDH) or a multiple quantum well (MQW) structure. The semiconductor device further includes a third semiconductor layer 21 and a fourth semiconductor layer 22 arranged respectively on two sides of the functional structure 19. The third semiconductor layer 21 may have a conductivity type different from a conductivity type of the fourth semiconductor layer 22. The semiconductor device may further include a first electrode 23 and a second electrode 24. The first electrode 23 is on the fourth semiconductor layer 22 and is electrically connected to the fourth semiconductor layer 22. The second electrode 24 is on the third semiconductor layer 21 and is electrically connected to the third semiconductor layer 21. In the embodiment, the first electrode 23 and the second electrode 24 are on the same side of the semiconductor substrate 10. Specifically, the electrode 23 and the second electrode 24 are both on the first side 141 of the second semiconductor layer 14.

In another embodiment, the first electrode 23 and the second electrode 24 are on two opposite sides of the semiconductor substrate 10. Specifically, the first electrode 23 and the second electrode 24 are arranged respectively on the first side 141 and the second side 142 of the second semiconductor layer 14.

Another embodiment of the present disclosure may be based on a combination or an alteration of structure as described in aforementioned embodiments. For example, in an embodiment, the semiconductor device shown in FIG. 3E may include the first electrode 23, the second electrode 24, and/or the third semiconductor layer 21 and the fourth semiconductor 22 as shown in FIG. 4. In an embodiment, the first electrode 23 and the second electrode 24 are arranged respectively on two opposite sides of the carrier substrate 18. In another embodiment, the first electrode 23 and the second electrode 24 are arranged on the same side of the carrier substrate 18.

Figure 5:
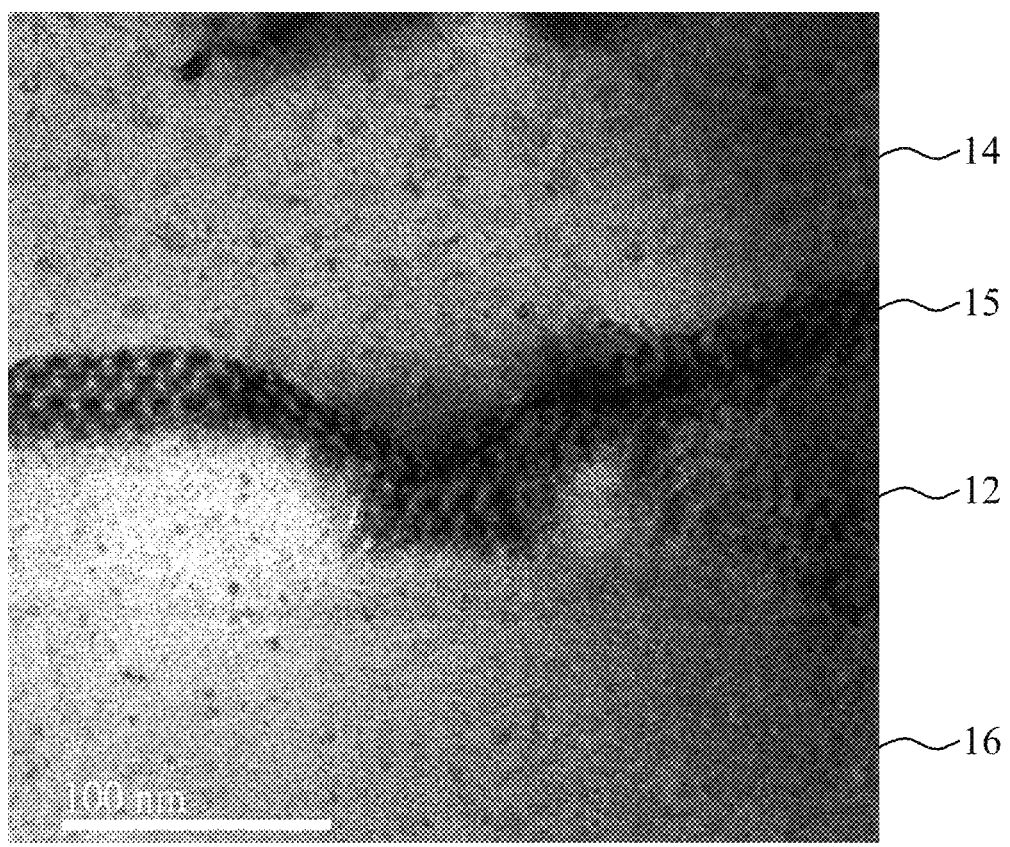
FIG. 5 shows a TEM (transmission electron microscopy) image of a semiconductor substrate in accordance with an embodiment of the present disclosure.

FIG. 5 shows a semiconductor substrate in an embodiment of the present disclosure observed by TEM (transmission electron microscopy). The semiconductor substrate shown in FIG. 5 can correspond to the structure as shown in FIG. 2. In this embodiment, the growth substrate 16 is a Ge substrate and has a diamond crystal structure. A thickness of the growth substrate 16 is larger than 150 μm, and the growth substrate 16 has a lattice constant of about 5.66 Å. The first semiconductor layer 12 is epitaxially grown on the growth substrate 16. In this embodiment, the material of the first semiconductor layer 12 is GaAs, and the first semiconductor layer 12 has a zinc blende crystal structure. A thickness of the first semiconductor layer 12 is about 50 nm, and the first semiconductor layer 12 has a lattice constant of about 5.65 Å. The second semiconductor layer 14 is epitaxially grown on the first semiconductor layer 12. In this embodiment, the material of the second semiconductor layer 14 is InP and the second semiconductor layer 14 has a zinc blende crystal structure. A thickness of the second semiconductor layer 14 is about 3 μm, and the second semiconductor layer 14 has a lattice constant of about 5.87 Å. A ratio of a difference between the lattice constants of the second semiconductor layer 14 and the first semiconductor layer 12 to the lattice constant of the first semiconductor layer 12 is about 0.039. The thickness of the interface structure 15 is about 50 nm, and the interface structure 15 includes InP and GaAs. The geometric average roughness (Rq) of the second semiconductor layer 14 is measured and is less than 10 nm. The range for measuring the geometric average roughness (Rq) is 1 μm×1 μm. Referring to FIG. 5, there are no apparent threading dislocations in the second semiconductor layer 14. The threading dislocation density is less than $10^9/cm^2$, which can be obtained by calculating the number of the threading dislocations shown in a TEM image. The semiconductor substrate shown in FIG. 5 can be served as a base for further epitaxial growth. In some embodiments, the growth substrate 16 may be further removed if needed.

Figure 6:
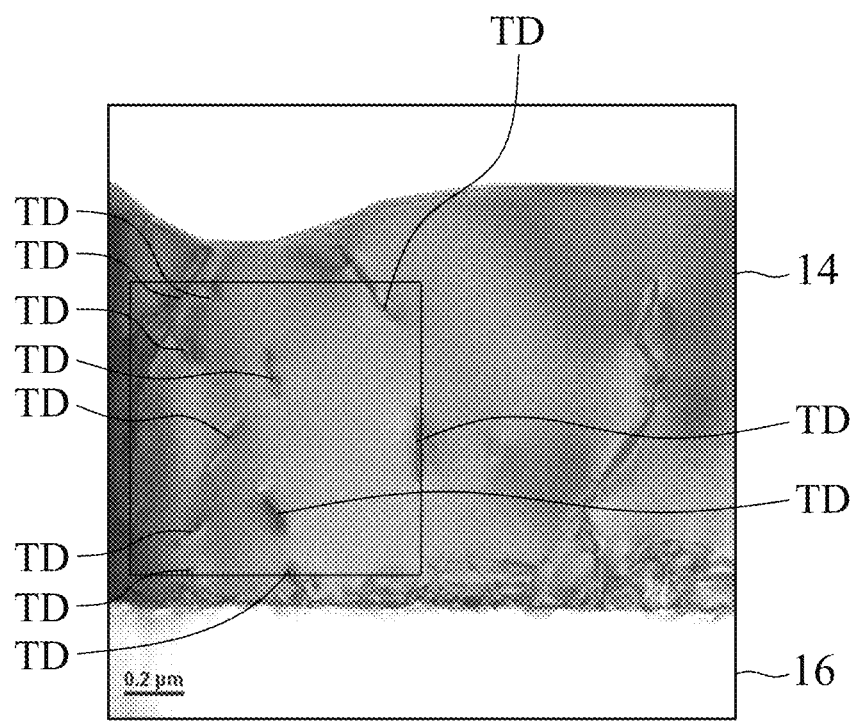
FIG. 6 shows a TEM image of a sectional view of a reference structure.
Figure 7:
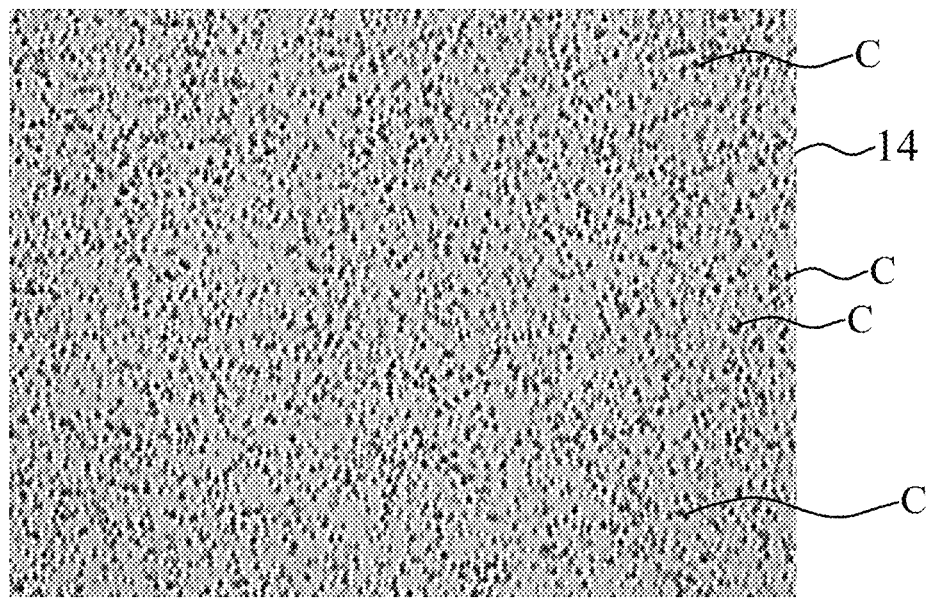
FIG. 7 shows a TEM image of an upper surface of the reference structure.

FIG. 6 shows a sectional view of a reference structure observed by TEM, and FIG. 7 shows a TEM image of an upper surface of the reference structure. The reference structure can correspond to the structure of FIG. 2 but is devoid of the first semiconductor layer 12. In other words, the second semiconductor layer 14 directly contacts the growth substrate 16 and forms a two-layer structure. In the reference structure, the growth substrate 16 is a GaAs substrate and has a zinc blende crystal structure. A thickness of the growth substrate 16 is larger than 150 μm. The second semiconductor layer 14 is epitaxially grown on the growth substrate 16. In the reference structure, the material of the second semiconductor layer 14 is InP and the second semiconductor layer 14 has a zinc blende crystal structure. A thickness of the second semiconductor layer 14 is about 3 μm. Referring to FIG. 6, some threading dislocations TD can be observed in the second semiconductor layer 14. Referring to FIG. 7, some crystallographic defects C can be observed on the upper surface of the second semiconductor layer 14, and these crystallographic defects C may be caused by threading dislocations. The geometric average roughness (Rq) of the second semiconductor layer 14 is measured and is larger than 50 nm. The range for measuring the geometric average roughness (Rq) is 1 μm×1 μm. The threading dislocation density of the second semiconductor layer 14 can be obtained by calculating the number of the threading dislocations shown in a TEM image. The area defined by a square frame as shown in FIG. 6 is about 1 μm×μm, and there are 11 threading dislocations in the area. Therefore, the threading dislocation density of the second semiconductor layer 14 shown in FIG. 6 is larger than $10^9/cm^2$.

Figure 8:
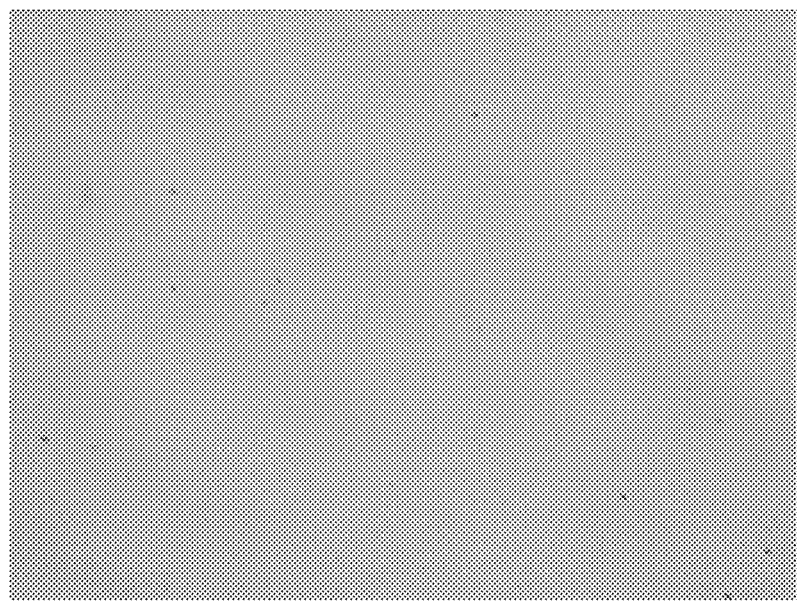
FIG. 8 shows a TEM image of an upper surface of a semiconductor substrate in accordance with an embodiment of the present disclosure.

FIG. 8 shows a semiconductor substrate in an embodiment of the present disclosure observed by TEM (transmission electron microscopy). The semiconductor substrate shown in FIG. 8 can correspond to the structure as shown in FIG. 2. In this embodiment, the growth substrate 16 is a silicon substrate and has a diamond crystal structure. A thickness of the growth substrate 16 is larger than 150 μm, and the growth substrate 16 has a lattice constant of about 5.43 Å. A first semiconductor layer 12 is epitaxially grown on the growth substrate. In this embodiment, the material of the first semiconductor layer 12 is $Al_{0.5}Ga_{0.5}P$ and the first semiconductor layer 12 has a zinc blende crystal structure. A thickness of the first semiconductor layer 12 is about 50 nm, and the first semiconductor layer 12 has a lattice constant of about 5.48 Å. A second semiconductor layer 14 is epitaxially grown on the first semiconductor layer 12. In this embodiment, the material of the second semiconductor layer 14 is InP and the second semiconductor layer 14 has a zinc blende crystal structure. A thickness of the second semiconductor layer 14 is about 3 μm, and the second semiconductor layer 14 has a lattice constant of about 5.87 Å. A ratio of a difference between the lattice constants of the second semiconductor layer 14 and the first semiconductor layer 12 to the lattice constant of the first semiconductor layer 12 is about 0.071. Referring to FIG. 8, there are no apparent crystallographic defects on the upper surface of the second semiconductor layer 14. The number of crystallographic defects is apparently less than the number of crystallographic defects C shown in FIG. 7. The geometric average roughness (Rq) of the second semiconductor layer of the semiconductor substrate is measured and is less than 10 nm. The range for measuring the geometric average roughness (Rq) is 1 μm×1 μm. Furthermore, the threading dislocation density is less than $10^9/cm^2$, which can be obtained by calculating the number of the threading dislocations shown in a TEM image of the semiconductor substrate. The semiconductor substrate can be served as a base for further epitaxial growth. In some embodiments, the growth substrate 16 may be further removed if needed.

Based on above, by providing a first semiconductor layer lattice-matched with the growth substrate but having a crystal structure different from the crystal structure of the growth substrate, the surface quality of the second semiconductor layer can be further improved even if the second semiconductor layer has a lattice constant different from that of the material of the first semiconductor layer. Specifically, the number of threading dislocations formed in the second semiconductor layer can be further reduced, and a geometric average roughness (Rq) of a surface on the second semiconductor layer can also be reduced. The second semiconductor layer with a better epitaxial quality can be obtained, such that a semiconductor substrate with a better epitaxial quality can be obtained.

The semiconductor substrate and the semiconductor device of the present disclosure may be applied to, for example, a sensor, a night vision system, a blood-oxygen monitor, a power amplifier, a radio-frequency (RF) device, or a device for transferring information. Specifically, the semiconductor device may be a high electron mobility transistor (HEMT) including GaAs, and it can be applied in a power amplifier. The semiconductor device may be a high electron mobility transistor (HEMT) including GaN, and it can be applied in a radio-frequency (RF) device.

It should be realized that each of the embodiments mentioned in the present disclosure is only used for describing the present disclosure, but not for limiting the scope of the present disclosure. Any obvious modification or alteration is not departing from the spirit and scope of the present disclosure. Same or similar components in different embodiments or components having the same numerals in different embodiments may have same physical or chemical characteristics. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:

1. A semiconductor substrate, comprising:
    a first semiconductor layer having a first lattice constant (L1), a first crystal structure and a first thickness;
    a second semiconductor layer on the first semiconductor layer, having a second lattice constant (L2), a second crystal structure and a second thickness larger than or equal to the first thickness; and
    a growth substrate directly contacting the first semiconductor layer and having a third crystal structure;
    wherein the first semiconductor layer is between the growth substrate and the second semiconductor layer, the third crystal structure is different from the first crystal structure, and a ratio of a difference (L2-L1) between the second lattice constant (L2) and the first lattice constant (L1) to the first lattice constant (L1) is greater than 0.036 and not greater than 0.2.

2. The semiconductor substrate of claim 1, wherein the first semiconductor layer directly contacts the second semiconductor layer.

3. The semiconductor substrate of claim 1, wherein the first crystal structure is the same as the second crystal structure.

4. The semiconductor substrate of claim 3, wherein both the first semiconductor layer and the second semiconductor layer comprise a zinc blende crystal structure.

5. The semiconductor substrate of claim 1, wherein the first semiconductor layer comprises a first III-V semiconductor material, and the second semiconductor layer comprises a second III-V semiconductor material.

6. The semiconductor substrate of claim 5, wherein the first III-V semiconductor material and the second III-V semiconductor material comprise Ga, Al, As, P, Sb or In.

7. The semiconductor substrate of claim 1, wherein the first semiconductor layer is lattice-matched with the growth substrate.

8. The semiconductor substrate of claim 1, wherein the third crystal structure comprises a diamond crystal structure, and the first crystal structure comprises a zinc blende crystal structure.

9. The semiconductor substrate of claim 1, wherein the growth substrate has a third lattice constant (L3), and a ratio of a difference (L1-L3) between the first lattice constant (L1) and the third lattice constant (L3) to the third lattice constant (L3) is between −0.005 and 0.005.

10. The semiconductor substrate of claim 1, wherein the second thickness is between 500 nm to 5 μm, both included, and the first thickness is between 30 nm and 500 nm, both included.

11. The semiconductor substrate of claim 1, wherein the first semiconductor layer has a threading dislocation density less than $10^9/cm^2$.

12. The semiconductor substrate of claim 1, wherein the second semiconductor layer has an upper surface with a geometric average roughness (Rq) of 50 nm or less.

13. A semiconductor substrate comprising:
a first semiconductor layer comprising a first III-V semiconductor material and having a first lattice constant (L1) and a first thickness; and
a second semiconductor layer on the first semiconductor layer, comprising a second III-V semiconductor material and having a second lattice constant (L2) and a second thickness larger than or equal to the first thickness;
wherein the first III-V semiconductor material comprises Ga and the second III-V semiconductor material comprises In, and a ratio of a difference (L2-L1) between the second lattice constant (L2) and the first lattice constant (L1) to the first lattice constant (L1) is greater than 0.036, and not greater than 0.2.

14. The semiconductor substrate of claim 13, further comprising a growth substrate directly contacting the first semiconductor layer.

15. The semiconductor substrate of claim 14, wherein the first semiconductor layer has a first crystal structure and the growth substrate has a third crystal structure different from the first crystal structure.

16. The semiconductor substrate of claim 13, wherein the first semiconductor layer has a first crystal structure, the second semiconductor layer has a second crystal structure, and the first crystal structure is the same as the second crystal structure.

17. The semiconductor substrate of claim 13, wherein the second semiconductor layer has an upper surface with a geometric average roughness (Rq) of 50 nm or less.

18. The semiconductor substrate of claim 13, wherein the first semiconductor layer has a threading dislocation density less than $10^9/cm^2$.

19. The semiconductor substrate of claim 13, further comprising a functional structure on the second semiconductor layer, and the functional structure comprises an active region which is capable of emitting a light.

20. The semiconductor substrate of claim 19, wherein the light has a peak wavelength between 800 nm and 3000 nm.

* * * * *